United States Patent
Lee et al.

(10) Patent No.: US 9,780,082 B2
(45) Date of Patent: Oct. 3, 2017

(54) SEMICONDUCTOR DEVICE, LAYOUT SYSTEM, AND STANDARD CELL LIBRARY

(71) Applicants: Dae-Seong Lee, Busan (KR);
Dae-Young Moon, Yongin-si (KR);
Min-Su Kim, Hwaseong-si (KR)

(72) Inventors: Dae-Seong Lee, Busan (KR);
Dae-Young Moon, Yongin-si (KR);
Min-Su Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/051,918

(22) Filed: Feb. 24, 2016

(65) Prior Publication Data

US 2016/0268243 A1  Sep. 15, 2016

(30) Foreign Application Priority Data

Mar. 12, 2015 (KR) .................. 10-2015-0034357
Apr. 24, 2015 (KR) .................. 10-2015-0057968

(51) Int. Cl.
| | | |
|---|---|---|
| H01L 27/00 | (2006.01) | |
| H01L 27/02 | (2006.01) | |
| H01L 27/092 | (2006.01) | |
| H01L 27/088 | (2006.01) | |

(52) U.S. Cl.
CPC ...... *H01L 27/0207* (2013.01); *H01L 27/0203* (2013.01); *H01L 27/088* (2013.01); *H01L 27/092* (2013.01)

(58) Field of Classification Search
CPC .......................... H01L 27/088; H01L 27/0203
See application file for complete search history.

(56) References Cited

U.S. PATENT DOCUMENTS

| | | |
|---|---|---|
| 7,023,058 B2 | 4/2006 | Kanmo et al. |
| 7,345,511 B2 | 3/2008 | Morgenshtein et al. |
| 7,465,970 B2 | 12/2008 | Wu et al. |
| 7,590,900 B2 | 9/2009 | Kim et al. |
| 7,649,395 B2 | 1/2010 | Ahmadi |
| 8,174,052 B2 | 5/2012 | Kim et al. |
| 8,451,040 B2 | 5/2013 | Lee et al. |
| 8,612,914 B2 | 12/2013 | Sherlekar et al. |
| 8,856,704 B2 | 10/2014 | Baeg |

(Continued)

FOREIGN PATENT DOCUMENTS

JP     2005-341284 A     12/2005

*Primary Examiner* — Ngan Ngo
(74) *Attorney, Agent, or Firm* — Volentine & Whitt, PLLC

(57) ABSTRACT

A semiconductor device includes a substrate, a first transistor gated by an inverted voltage level of a first input signal to pull up a first node, a second transistor gated by a voltage level of a second input signal to pull down the first node, a third transistor gated by an inverted voltage level of the second input signal to pull up the first node, a fourth transistor gated by a voltage level of the first input signal to pull down the first node, a fifth transistor gated by the voltage level of the second input signal to pull down a second node, a sixth transistor gated by the inverted voltage level of the first input signal to pull up the second node, a seventh transistor gated by the voltage level of the first input signal to pull down the second node, and an eighth transistor gated by the inverted voltage level of the second input signal to pull up the second node.

19 Claims, 15 Drawing Sheets

(56) References Cited

U.S. PATENT DOCUMENTS

| | | | |
|---|---|---|---|
| 2002/0140001 A1* | 10/2002 | Komaki | H01L 27/11807 257/207 |
| 2010/0155783 A1* | 6/2010 | Law | H01L 27/0207 257/206 |
| 2014/0285236 A1 | 9/2014 | Cheng et al. | |
| 2015/0370950 A1* | 12/2015 | Kawa | G06F 17/5072 716/119 |
| 2016/0063166 A1* | 3/2016 | Hsieh | G06F 17/5072 257/774 |

* cited by examiner

1200

1300

1400

SEMICONDUCTOR DEVICE, LAYOUT SYSTEM, AND STANDARD CELL LIBRARY

This application claims priority from Korean Patent Application No. 10-2015-0034357 filed on Mar. 12, 2015 and Korean Patent Application No. 10-2015-0057968 filed on Apr. 24, 2015 in the Korean Intellectual Property Office, the disclosures of which are hereby incorporated by reference in their entirety.

BACKGROUND

1. Field of the Inventive Concept

The present inventive concept relates to a semiconductor device, a layout system for laying out elements of a semiconductor device, and a standard cell library for use in designing semiconductor devices, and a method of fabricating a semiconductor device using a standard cell library.

2. Description of the Related Art

The area of a cell of an integrated circuit of a semiconductor device needs to be minimized in order to increase the integration density of the device. To scale down the area of the cell, the locations of transistors, the signal routing paths, and the shapes and locations of interconnections, i.e., the layout of elements that constitute the cell, must be optimized.

SUMMARY

According to an aspect of the present inventive concept, there is provided a semiconductor device comprising a substrate, a first transistor which is gated by an inverted voltage level of a first input signal to pull up a first node, a second transistor which is gated by a voltage level of a second input signal to pull down the first node, a third transistor which is gated by an inverted voltage level of the second input signal to pull up the first node, a fourth transistor which is gated by a voltage level of the first input signal to pull down the first node, a fifth transistor which is gated by the voltage level of the second input signal to pull down a second node, a sixth transistor which is gated by the inverted voltage level of the first input signal to pull up the second node, a seventh transistor which is gated by the voltage level of the first input signal to pull down the second node, and an eighth transistor which is gated by the inverted voltage level of the second input signal to pull up the second node, and first and second metal layers disposed on the substrate at different levels from one another. The first and second metal layers each comprise a plurality of electrically conductive connections. An input terminal of the first transistor and an input terminal of the fourth transistor are electrically connected by the connections of the first metal layer, an input terminal of the second transistor and an input terminal of the third transistor are electrically connected by the connections of the second metal layer. Also, the second transistor and the fifth transistor share a first gate disposed on the substrate, and the fourth transistor and the seventh transistor share a second gate disposed on the substrate.

According to another aspect of the present inventive concept, there is provided a semiconductor device comprising a substrate having a first area disposed on a side of an axis extending in a first direction across the substrate and a second area of the substrate which is disposed on the other side of the axis, a first gate which extends across the first area and the second area in a second direction perpendicular to the first direction and is disposed at a first level in the device relative to the substrate, a second gate which extends across the first area and the second area in the second direction as from the first gate in the first direction and is disposed at the first level in the device, a first connection which electrically connects an input terminal of a first transistor constituted by the first gate and an input terminal of a fourth transistor constituted by the second gate in the first area and is disposed at a second level higher than the first level relative to the substrate, a second connection which electrically connects an input terminal of a second transistor constituted by the first gate and an input terminal of a third transistor constituted by the second gate in the first area and is disposed at a third level higher than the first level and lower than the second level relative to the substrate, a third connection which is disposed at the second level in the device, and a fourth connection which is disposed at the third level in the device. Also, the input terminal of the second transistor and the input terminal of the fifth transistor are constituted by parts of the first gate, respectively, and the input terminal of the fourth transistor and the input terminal of the seventh transistor are constituted by parts of the second gate, respectively.

According to still another aspect of the present inventive concept, there is provided a semiconductor device comprising a substrate, a power rail which extends longitudinally on the substrate in a first direction such that the substrate has a first area disposed on one side of the power rail and a second area disposed on the other side of the power rail, a first gate which extends across the first area and the second area in a second direction perpendicular to the first direction and has a first overlap part overlapping the power rail, and a second gate which extends across the first area and the second area in the second direction as spaced from the first gate in the first direction and has a second overlap part overlapping the power rail. A first transistor of the device is disposed at a location where the first gate extends in the first area, a fourth transistor of the device is disposed at a location where the second gate extends in the first area, a seventh transistor of the device is disposed at a location where the second gate extends in the second area, and a sixth transistor of the device is disposed at a location where the first gate extends in the second area. The first, fourth, seventh and sixth transistors are gated by the same first input signal. Still further, a second transistor of the device is disposed at a location where the first gate extends in the first area, a third transistor of the device is disposed at a location where the second gate extends in the first area, a fifth transistor of the device is disposed at a location where the first gate extends in the second area, and an eighth transistor of the device is disposed at a location where the second gate extends in the second area. The second, third, fifth and eighth transistors are gated by the same second input signal. The semiconductor device also comprises a first metal layer including a connection which electrically connects an input terminal of the first transistor and an input terminal of the fourth transistor in the first area, and a connection which electrically connects an input terminal of the fifth transistor and an input terminal of the eighth transistor in the second area, and a second metal layer including a connection which electrically connects an input terminal of the second transistor and an input terminal of the third transistor in the first area and a connection which electrically connects an input terminal of the sixth transistor and an input terminal of the seventh transistor in the second area. The first and second metal layers are disposed at different levels from one another in the device, the input terminal of the second transistor and the input terminal of the fifth transistor are electrically connected by the first overlap part, and the input terminal of the fourth transistor and the input terminal of the seventh transistor are electrically connected by the second overlap part.

According to still another aspect of the present inventive concept, there is provided a semiconductor device comprising a substrate, a power rail which extends longitudinally in a first direction on the substrate, first, second, third and fourth input terminals which are sequentially disposed along a first line extending in a second direction perpendicular to the first direction, fifth, sixth, seventh and eighth input terminals which are spaced from the first line in the first direction and are sequentially disposed along a second line extending in the second direction, a first connection which electrically connects the first input terminal and the sixth input terminal, a second connection which intersects the first connection as viewed in plan and electrically connects the second input terminal and the fifth input terminal, a third connection which electrically connects the third input terminal and the eighth input terminal, a fourth connection which intersects the third connection as viewed in plan and electrically connects the fourth input terminal and the seventh input terminal, a first interconnection which intersects the power rail as viewed in plan and electrically connects the second input terminal and the third input terminal, and a second interconnection which intersects the power rail as viewed in plan and electrically connects the sixth input terminal and the seventh input terminal. The first interconnection is part of a first gate constituting the second input terminal and the third input terminal, and the second interconnection is part of a second gate constituting the sixth input terminal and the seventh input terminal.

According to still another aspect of the present inventive concept, there is provided a semiconductor device comprising a substrate, gate lines spaced apart from each other in a first direction and each extending longitudinally over the substrate in a second direction perpendicular to the first direction, a first metal layer disposed on the substrate and comprising a first set of discrete electrically conductive connections, and a second metal layer disposed on the substrate at a different level than the first metal layer and comprising a second set of discrete electrically conductive connections. The device has a plurality of cells disposed side by side in the second direction. Each of the cells is constituted by active regions of the substrate spaced from each other in the second direction, first and second ones of the gate lines extending longitudinally over the active regions, a first pair of transistors at respective locations where the first gate line extends over the active regions with the first gate line providing input terminals in the cell for the first pair of transistors, a second pair of transistors at respective locations where the second gate line extends over the active regions with the second gate line providing input terminals for the second pair of transistors in the cell, one of the connections of the first metal layer, and one of the connections of the second metal layer. In each cell, the connection of the first metal layer overlaps the first and second gate lines and electrically connects the input terminal of one of the transistors of the first pair thereof to the input terminal of one of the transistors of the second pair. Also, in each cell, the connection of the second metal layer overlaps the first and second gate lines and electrically connects the input terminal of the other of the transistors of the first pair to the input terminal of the other of the transistors of the second pair.

According to still another aspect of the present inventive concept, there is provided a layout system of a semiconductor device comprising a processor, a storage which stores elements that can be laid out in one or more standard cell designs, and a layout module which lays out a semiconductor device based on one or more of the standard cell designs using the processor and according to a defined requirement, wherein the layout module lays out a first power rail along a first direction, lays out a second power rail along the first direction with a first gap from the first power rail in a second direction perpendicular to the first direction, lays out a third power rail which extends along the first direction with a second gap from the second power rail in the second direction on a substrate, defines a first active region and a second active region between the first power rail and the second power rail such that the first active region is adjacent to the first power rail and that the second active region is adjacent to the second power rail, defines a third active region and a fourth active region between the second power rail and the third power rail such that the third active region is adjacent to the second power rail and that the fourth active region is adjacent to the third power rail, lays out a first gate which intersects the first through fourth active regions and extends along the second direction and a second gate which is separated from the first gate and extends along the second direction, defines first, second, fifth and sixth transistors sharing the first gate on the first through fourth active regions such that the first and second transistors are disposed between the first power rail and the second power rail and such that that the fifth and sixth transistors are disposed between the second power rail and the third power rail, defines third, fourth, seventh and eighth transistors sharing the second gate on the first through fourth active regions such that the third and fourth transistors are disposed between the first power rail and the second power rail and that the seventh and eighth transistors are disposed between the second power rail and the third power rail, lays out a connection connecting an input terminal of the first transistor and an input terminal of the fourth transistor and a connection connecting an input terminal of the fifth transistor and an input terminal of the eighth transistor constituted by a first metal layer disposed at a first height relative to the substrate, and lays out a connection connecting an input terminal of the second transistor and an input terminal of the third transistor and a connection connecting an input terminal of the sixth transistor and an input terminal of the seventh transistor constituted by a second metal layer disposed at a second height smaller than the first height relative to the substrate.

According to yet another aspect of the present inventive concept, there is provided a non-transitory computer readable medium storing a standard cell library of at least one standard cell of a layout of elements in which a power rail extends on a substrate along a first direction, a first area of the substrate is disposed on a side of the power rail and a second area of the substrate is disposed on the other side of the power rail, a first gate extends across the first area and the second area along a second direction perpendicular to the first direction and is disposed at a first level from the substrate in a third direction perpendicular to each of the first direction and the second direction, a second gate extends across the first area and the second area along the second direction as spaced from the first gate and disposed at the first level from the substrate, a first connection connects an input terminal of a first transistor disposed on the first gate and an input terminal of a fourth transistor disposed on the second gate in the first area and disposed at a second level higher than the first level relative to the substrate, a second connection connects an input terminal of a second transistor disposed on the first gate and an input terminal of a third transistor disposed on the second gate in the first area and is disposed at a third level higher than the first level and lower than the second level relative to the substrate, a third connection connects an input terminal of a fifth transistor disposed on the first gate and an input terminal of an eighth transistor disposed on the second gate in the second area and is disposed at the second level, and a fourth connection connects an input terminal of a sixth transistor disposed on the first gate and an input terminal of a seventh transistor disposed on the second gate in the second area and is disposed at the third level, and in which the input terminal of the second transistor and the input terminal of the fifth transistor are connected by a part of the first gate, and the input terminal of the fourth transistor and the input terminal of the seventh transistor are connected by a part of the second gate.

BRIEF DESCRIPTION OF THE DRAWINGS

The above and other aspects and features of the present inventive concept will become more apparent from the following detailed description of examples thereof made with reference to the attached drawings, in which.

DETAILED DESCRIPTION

Figure 1:
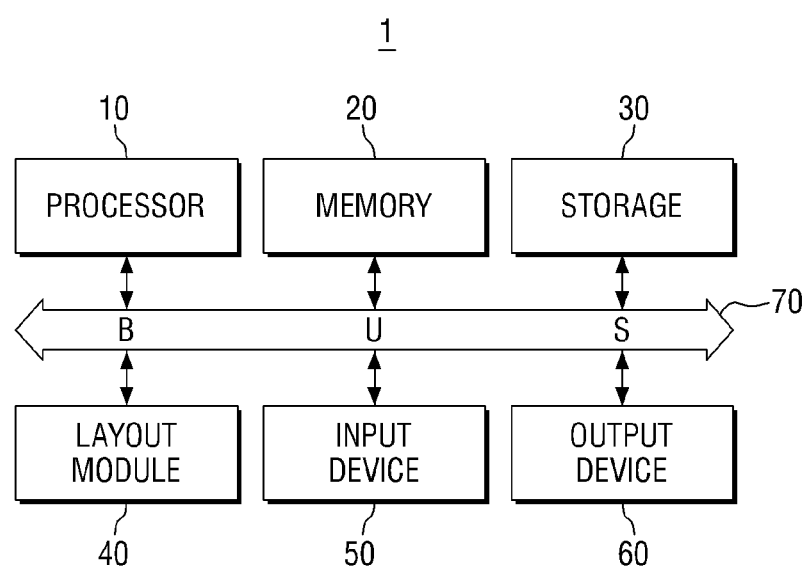
FIG. 1 is a block diagram of a layout system according to the present inventive concept.

Examples will be described in detail with reference to the accompanying drawings. The inventive concept, however, may be exemplified in various different forms, and should not be construed as being limited only to the illustrated examples. Rather, these examples are provided so that this disclosure will be thorough and complete, and will fully convey the inventive concept to those skilled in the art. Accordingly, known processes, elements, and techniques are not described with respect to some of the examples of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular examples only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 illustrates a layout system 1 according to the present inventive concept.

Referring to FIG. 1, the layout system 1 is configured perform a layout method according to the inventive concept. To this end, the layout system 1 may include one or more instructions (e.g., software programs) enabling the layout system 1 to perform a layout method an example of which is described later on. In one example of the present inventive concept, the layout system 1 may operate as a stand-alone device or operate together with another device electrically connected to the layout system 1. When connected to another device via, e.g., a network, the layout system 1 may operate as a server or a client in a server-client environment and operate as one peer in a peer-to-peer network environment or a distributed network environment.

The layout system 1 may include a processor 10 (e.g., a central processing unit (CPU), a graphic processing unit (GPU), a digital signal processor (DSP), application specific integrated circuits (ASICs), etc.), a memory 20, a storage 30, a layout module 40, an input device 50, and an output device 60. The processor 10, the memory 20, the storage 30, the layout module 40, the input device 50 and the output device 60 may be electrically connected through a bus 70 so as to exchange data with each other.

The storage 30 may include a computer-readable medium which includes instructions for executing a layout method and data about the layout of semiconductor devices. The instructions may reside in the memory 20 (e.g., a main memory) or in the processor 10 (e.g., a cache of the processor 10) while the method is being executed by the layout system 1. The data about the layout may include, for example, restrictions such as design rules, data about various elements used in the layout of the semiconductor device, standard cell data, etc. The layout system 1 may receive the data about the layout from a user or another device or system connected to the layout system 1 using the input device 50 and send stored data related to the layout of the semiconductor device, result data, etc. to the user or another device or system connected to the layout system 1 using the output device 60.

The layout module 40 may lay out one or more standard cells of a semiconductor device using the processor 10 and according to defined requirements, e.g., design rules. The designs of the standard cells may be stored in the storage 30. Specific methods by which the layout module 30 lays out standard cells, i.e., designs a semiconductor device, according the present inventive concept will be described later with reference to FIG. 3A.

Figure 2:
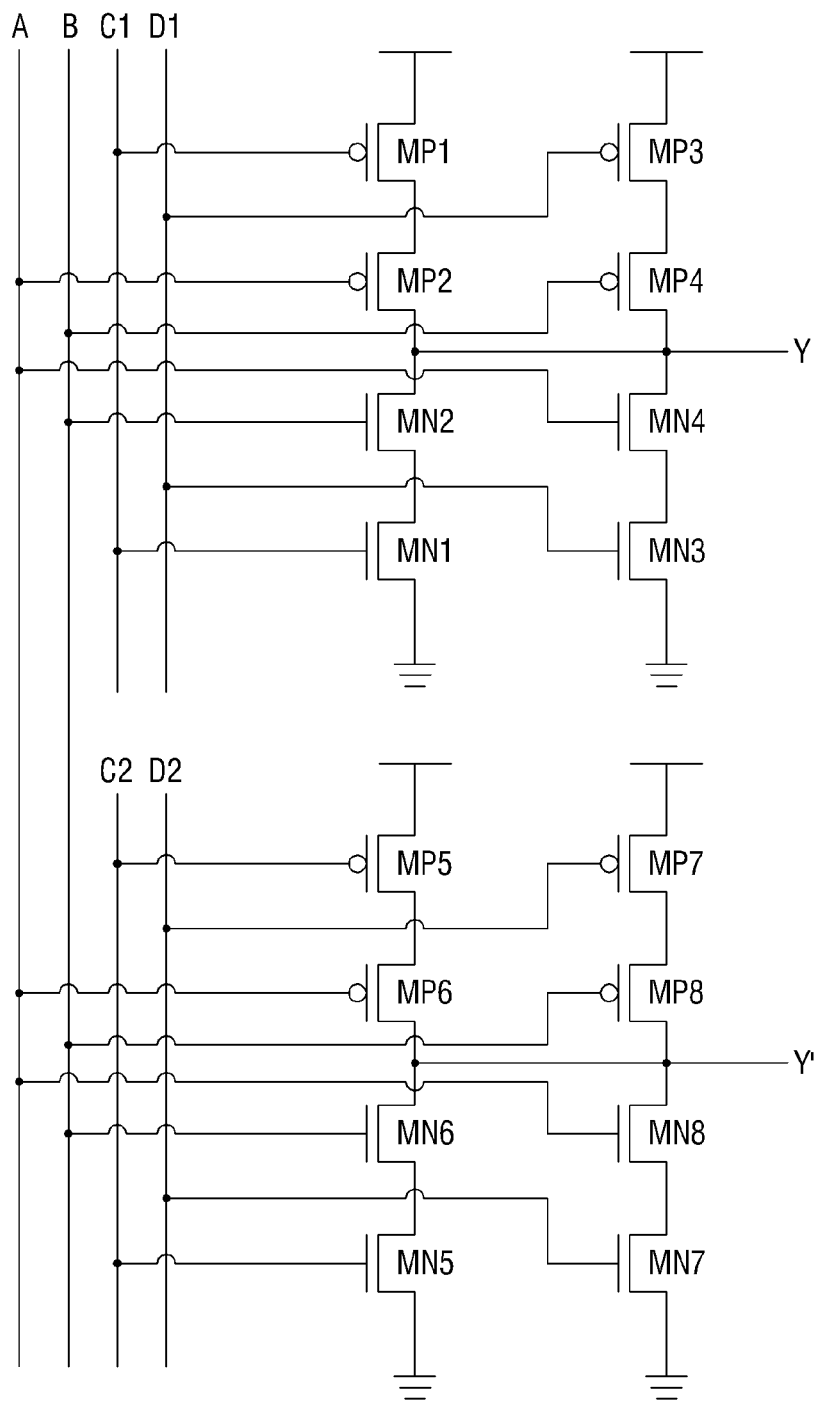
FIG. 2 is a circuit diagram of an example of a semiconductor device according to the present inventive concept.

FIG. 2 illustrates circuitry of a semiconductor device according to the present inventive concept.

Referring to FIG. 2, the circuitry includes a first transistor MP2 which is gated by an inverted voltage level of a first input signal A to pull up a first node Y, a second transistor MN2 which is gated by a voltage level of a second input signal B to pull down the first node Y, a third transistor MP4 which is gated by an inverted voltage level of the second input signal B to pull up the first node Y, a fourth transistor MN4 which is gated by the voltage level of the first input signal A to pull down the first node Y, a fifth transistor MN6 which is gated by the voltage level of the second input signal B to pull down a second node Y', a sixth transistor MP6 which is gated by the inverted voltage level of the first input signal A to pull up the second node Y', a seventh transistor MN8 which is gated by the voltage level of the first input signal A to pull down the second node Y', and an eighth transistor MP8 which is gated by the inverted voltage level of the second input signal B to pull up the second node Y'.

In this example, the first input signal A is transmitted to the first transistor MP2, the fourth transistor MN4, the sixth transistor MP6 and the seventh transistor MN8 of the semiconductor device, and the second input signal B is transmitted to the second transistor MN2, the third transistor MP4, the fifth transistor MN6 and the eighth transistor MP8. Therefore, the first transistor MP2, the fourth transistor MN4, the sixth transistor MP6 and the seventh transistor MN8 may have respective input terminals electrically connected to each other, and the second transistor MN2, the third transistor MP4, the fifth transistor MN6 and the eighth transistor MP8 may have respective input terminals electrically connected to each other.

As will be described in greater detail later with reference to FIG. 3A, in the semiconductor device, the input terminal of the first transistor MP2 and the input terminal of the fourth transistor MN4 may be connected by a first metal layer (e.g., a "metal 1" layer of the device), and the input terminal of the second transistor MN2 and the input terminal of the third transistor MP4 may be connected by a second metal layer (e.g., the "metal 0" layer of the device). In addition, the input terminal of the fifth transistor MN6 and the input terminal of the eighth transistor MP8 may be connected by the first metal layer (e.g., the "metal 1" layer), and the input terminal of the sixth transistor MP6 and the input terminal of the seventh transistor MN8 may be connected by the second metal layer (e.g., the "metal 0" layer).

The second transistor MN2 and the fifth transistor MN6 may share, i.e., be constituted by, a first gate, and the fourth transistor MN4 and the seventh transistor MN8 may share a second gate. To this end, the gates of the second transistor MN2 and the fifth transistor MN6 may be constituted by a contiguous gate line (i.e., the first gate). Likewise, the gates of the fourth transistor MN4 and the seventh transistor MN8 may be constituted by a contiguous gate line (i.e., the second gate). In this example, the input terminal of the second transistor MN2 and the input terminal of the fifth transistor MN6 may be connected by a part (or first interconnection) of the first gate disposed on a substrate, and the input terminal of the fourth transistor MN4 and the input terminal of the seventh transistor MN8 may be connected by a part (or second interconnection) of the second gate disposed on the substrate.

The first gate and the second gate may be disposed at a first level in the device, the first metal layer may be disposed at a second level higher than the first level, and the second metal layer may be disposed at a third level higher than the first level and lower than the second level.

In the current example, the first transistor MP2, the third transistor MP4, the sixth transistor MP6 and the eighth transistor MP8 are P-type transistors, and the second transistor MN2, the fourth transistor MN4, the fifth transistor MN6 and the seventh transistor MN8 are N-type transistors. However, the present inventive concept is not limited thereto. That is, in another example according to the present inventive concept, the first, third, sixth and eighth transistors MP2, MP4, MP6 and MP8 are N-type transistors, and the second, fourth, fifth and seventh transistors MN2, MN4, MN6 and MN8 are P-type transistors.

In other examples of the present inventive concept, the circuitry further includes a transistor MP1 which is connected in series to the first transistor MP2 and gated by an inverted voltage level of an input signal C1 to provide a power supply voltage VDD, a transistor MN1 which is connected in series to the second transistor MN2 and gated by a voltage level of the input signal C1 to provide a ground voltage VSS, a transistor MP3 which is connected in series to the third transistor MP4 and gated by an inverted voltage level of an input signal D1 to provide the power supply voltage VDD, and a transistor MN3 which is connected in series to the fourth transistor MN4 and gated by a voltage level of the input signal D1 to provide the ground voltage VSS.

In some examples according to the present inventive concept, the circuitry further includes a transistor MP5 which is connected in series to the sixth transistor MP6 and gated by an inverted voltage level of an input signal C2 to provide the power supply voltage VDD, a transistor MN5 which is connected in series to the fifth transistor MN6 and gated by a voltage level of the input signal C2 to provide the ground voltage VSS, a transistor MP7 which is connected in series to the eighth transistor MP8 and gated by an inverted voltage level of an input signal D2 to provide the power supply voltage VDD, and a transistor MN7 which is connected in series to the seventh transistor MN8 and gated by a voltage level of the input signal D2 to provide the ground voltage VSS.

Figure 3A:
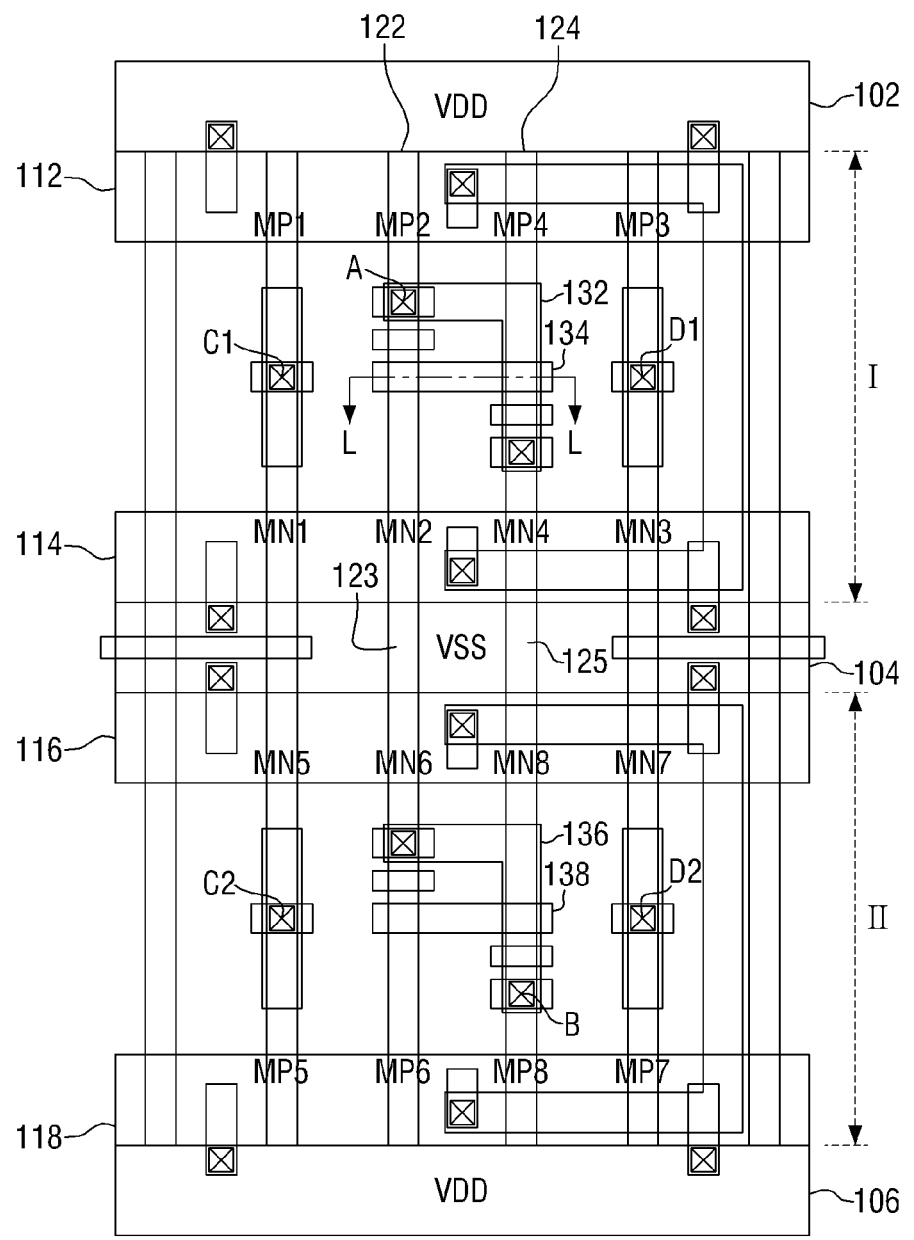
FIG. 3A is a layout diagram of an example of a semiconductor device according to the present inventive concept.
Figure 4A:
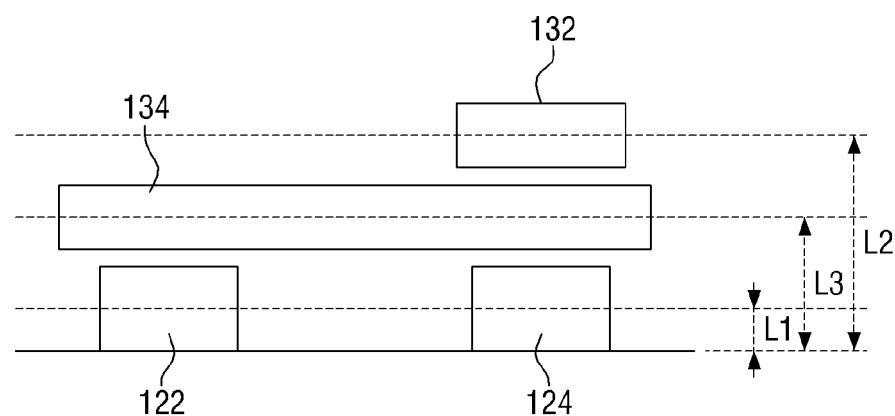
FIGS. 4A and 4B are each a cross-sectional view of a version of the semiconductor device having the layout shown in FIG. 3A, as taken along line L-L of FIG. 3A.
Figure 4B:
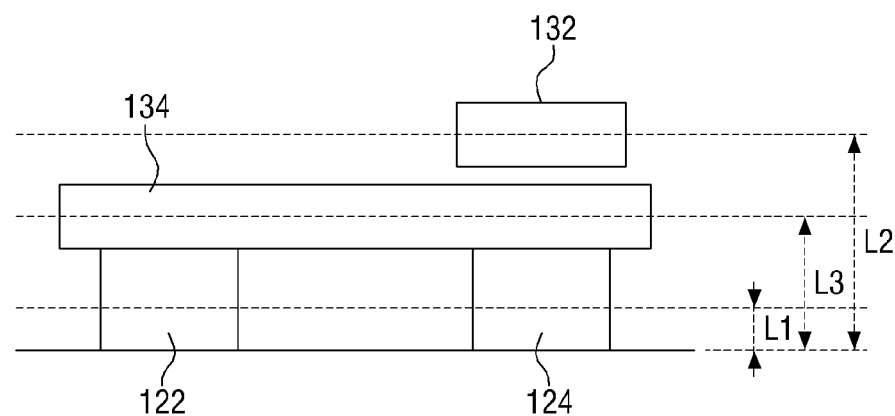

FIG. 3A illustrates one example of a layout of semiconductor devices according to the present inventive concept. FIGS. 4A and 4B are each a cross-sectional view of a semiconductor device having the layout illustrated in FIG. 3A, according to the present inventive concept, as taken along line L-L of FIG. 3A.

Referring to FIGS. 3A and 4A, the semiconductor device may include a first power rail 102, a second power rail 104, a third power rail 106, a first gate 122, and a second gate 124.

The first power rail 102, the second power rail 104, and the third power rail 106 extend longitudinally on a substrate in a first direction. A first area I is defined to one side of the second power rail 104, and a second area II is defined on the other side of the second power rail 104. Each of the first power rail 102, the second power rail 104 and the third power rail 106 may be a power supply voltage (VDD) rail which provides power or a grounded ground voltage (VSS) rail. In the current example, the first power rail 102 and the third power rail 106 are VDD rails, and the second power rail 104 is a VSS rail.

The first gate 122 extends across the first area I and the second area II in a second direction perpendicular to the first direction, and the second gate 124 is spaced from the first gate 122 in the first direction and extends across the first area I and the second area II in the second direction. In this example, the first gate 122 and the second gate 124 are disposed at a first level in the device, i.e., at the same distance from the substrate in a third direction perpendicular to each of the first direction and the second direction. Also, in the illustrated example, the first gate 122 and the second gate 124 extend perpendicular to and across the second power rail 104. Thus, the first gate 122 may include a first overlap part 123 which overlaps the second power rail 104, and the second gate 124 may include a second overlap part 125 which overlaps the second power rail 104. The first gate 122 and the second gate 124 may be polysilicon gates or metal gates.

In the illustrated example, a first transistor MP2, a second transistor MN2, a fifth transistor MN6, and a sixth transistor MP6 may comprise the first gate 122, and a third transistor MP4, a fourth transistor MN4, a seventh transistor MN8 and an eighth transistor MP8 may comprise the second gate 124. However, the present inventive concept is not limited to this disposition of the transistors. In addition, in the illustrated example, the second transistor MN2, the fourth transistor MN4, the fifth transistor MN6 and the seventh transistor MN8 are disposed adjacent to the second power rail 104 which is a VSS rail. However, the present inventive concept is not limited to this disposition of the transistors.

In the illustrated example, the first transistor MP2, the third transistor MP4, the sixth transistor MP6 and the eighth transistor MP8 are P-type transistors, and the second transistor MN2, the fourth transistor MN4, the fifth transistor MN6 and the seventh transistor MN8 are N-type transistors. However, the present inventive concept is not limited thereto. That is, in another example of the present inventive concept, the first, third, sixth and eighth transistors MP2, MP4, MP6 and MP8 are N-type transistors, and the second, fourth, fifth and seventh transistors MN2, MN4, MN6 and MN8 are P-type transistors.

The semiconductor device according to the illustrated example of the present inventive concept may include a first connection 132 and a second connection 134 in the first area I and a third connection 136 and a fourth connection 138 in the second area II. In the first area I, the first connection 132 connects an input terminal of the first transistor MP2 and an input terminal of the fourth transistor MN4, and the second connection 134 connects an input terminal of the second transistor MN2 disposed on the first gate 122 and an input terminal of the third transistor MP4 disposed on the second gate 124. In the second area II, the third connection 136 connects an input terminal of the fifth transistor MN6 and an input terminal of the eighth transistor MP8, and the fourth connection 138 connects an input terminal of the sixth transistor MP6 and an input terminal of the seventh transistor MN8.

Also, in this example, the first connection 132 and the third connection 136 are disposed at a second level in the device which is higher than the first level relative to the substrate, and the second connection 134 and the fourth connection 138 are disposed at a third level which is higher than the first level and lower than the second level relative to the substrate. That is, the first connection 132 and the third connection 136 are disposed at a different height (distance from the substrate) from the second connection 134 and the fourth connection 138. In some versions of this example, the first connection 132 intersects the second connection 134, and the third connection 136 intersects the fourth connection 138.

The first connection 132 and the third connection 136 may each be L-shaped as viewed in plan. In the illustrated example, the first connection 132 and the third connection 136 are oriented the same. However, the orientations of the first connection 132 and the third connection 136 may be different. The second connection 134 and the fourth connection 138 may each be bar-shaped as viewed in plan and hence, oriented the same.

In one version of this example of the present inventive concept, the first connection 132 and the third connection 136 are parts of a first metal layer disposed at the second level, and the second connection 134 and the fourth connection 138 are parts of a second metal layer disposed at the third level. Referring to FIG. 4A, the first gate 122 and the second gate 124 are disposed at a first level L1, the second connection 134 is disposed at a third level L3, and the first connection 132 is disposed at a second level L2. For example, the first connection 132 may be a "metal 1" layer, and the second connection 134 may be the "metal 0" layer. Alternatively, the first connection 132 may be the "metal 2" layer, and the second connection 134 may be the "metal 1" or "metal 0" layer.

Also, in this example of the present inventive concept, the first gate 122 or the second gate 124 may be electrically connected to the second connection 134. For example, an upper surface of the first gate 122 or the second gate 124 and a lower surface of the second connection 134 may contact each other to form an electrical connection. Alternatively, a conductive material for forming an electrical connection may be interposed between the upper surface of the first gate 122 or the second gate 124 and the lower surface of the second connection 134.

The first level L1, the second level L2 and the third level L3, as used herein, denote relative distances from the substrate to layout elements (e.g., the first gate 122, the second gate 124, the second connection 134, the first connection 132, etc.). Here, a reference point used to define a distance from a layout element to the substrate may be a central point of the layout element in the direction of its thickness, i.e., in the vertical direction. That is, the central point of a particular layout element may coincide with its "level." For example, referring again to FIG. 4A, a distance from the central point of the first gate 122 or the second gate 124 disposed at the first level L1 to the substrate may be smaller than a distance from the central point of the second connection 134 disposed at the third level L3 to the substrate, and a distance from the central point of the second connection 134 disposed at the third level L3 to the substrate may be smaller than a distance from the central point of the first connection 132 disposed at the second level L2 to the substrate.

In the example of the present inventive concept illustrated in FIG. 4B, the lower surface of the second connection 134 disposed at the third level L3 contacts the upper surface of the first gate 122 or the second gate 124 disposed at the first level L1. That is, a distance from the substrate to the lower surface of the second connection 134 disposed at the third level L3 may be equal to a distance from the substrate to the upper surface of the first gate 122 or the second gate 124 disposed at the first level L1. This relationship, i.e., contact, between the first gate 122 or the second gate 124 disposed at the first level L1 and the second connection 134 disposed at the third level L3 may be the same as the relationship between the second connection 134 disposed at the third level L3 and the first connection 132 disposed at the second level L2.

The input terminal of the second transistor MN2 and the input terminal of the fifth transistor MN6 may be connected by a part of the first gate 122 (e.g., the first overlap part 123 of the first gate 122), and the input terminal of the fourth transistor MN4 and the input terminal of the seventh transistor MN8 may be connected by a part of the second gate 124 (e.g., the second overlap part 125 of the second gate 124).

The layout module 40 of the layout system 1 described above with reference to FIG. 1 may design the layout of the semiconductor device as follows.

For example, the layout module 40 may lay out the first power rail 102 on the substrate to extend along the first direction, lay out the second power rail 104 to extend along the first direction as spaced from the first power rail 102 in the second direction perpendicular to the first direction, and lay out the third power rail 106 to extend along the first direction as spaced from the second power rail 104 in the second direction.

Next, the layout module 40 may define a first active region 112 and a second active region 114 between the first power rail 102 and the second power rail 104. The first active region 112 may be adjacent to the first power rail 102, and the second active region 114 may be adjacent to the second power rail 104. In addition, the layout module 40 may define a third active region 116 and a fourth active region 118 between the second power rail 104 and the third power rail 106. The third active region 116 may be adjacent to the second power rail 104, and the fourth active region 118 may be adjacent to the third power rail 106.

Next, the layout module 40 may lay out the first gate 122 to intersect the first through fourth active regions 112, 114, 116 and 118 in the second direction and lay out the second gate 124 along the second direction as spaced from the first gate 122.

The layout module 40 may lay out the positions of the first transistor MP2, the second transistor MN2, the fifth transistor MN6 and the sixth transistor MP6 using the first gate 122 and the first through fourth active regions 112, 114, 116 and 118. The first transistor MP2 and the second transistor MN2 may be disposed between the first power rail 102 and the second power rail 104, and the fifth transistor MN6 and the sixth transistor MP6 may be disposed between the second power rail 104 and the third power rail 106. The layout module 40 may lay out the third transistor MP4, the fourth transistor MN4, the seventh transistor MN8 and the eighth transistor MP8 using the second gate 124 and the first through fourth active regions 112, 114, 116 and 118. The third transistor MP4 and the fourth transistor MN4 may be disposed between the first power rail 102 and the second power rail 104, and the seventh transistor MN8 and the eighth transistor MP8 may be disposed between the second power rail 104 and the third power rail 106.

Next, the layout module 40 designs the connections between the input terminal of the first transistor MP2 and the input terminal of the fourth transistor MN4 and between the input terminal of the fifth transistor MN6 and the input terminal of the eighth transistor MP8, i.e., designs the trace constituted by the first metal layer disposed at a first height from the substrate. In addition, the layout module 40 designs the connections between the input terminal of the second transistor MN2 and the input terminal of the third transistor MP4 and between the input terminal of the sixth transistor MP6 and the input terminal of the seventh transistor MN8, i.e., designs the trace constituted by the second metal layer disposed at a second height, lower than the first height, from the substrate.

Figure 3B:
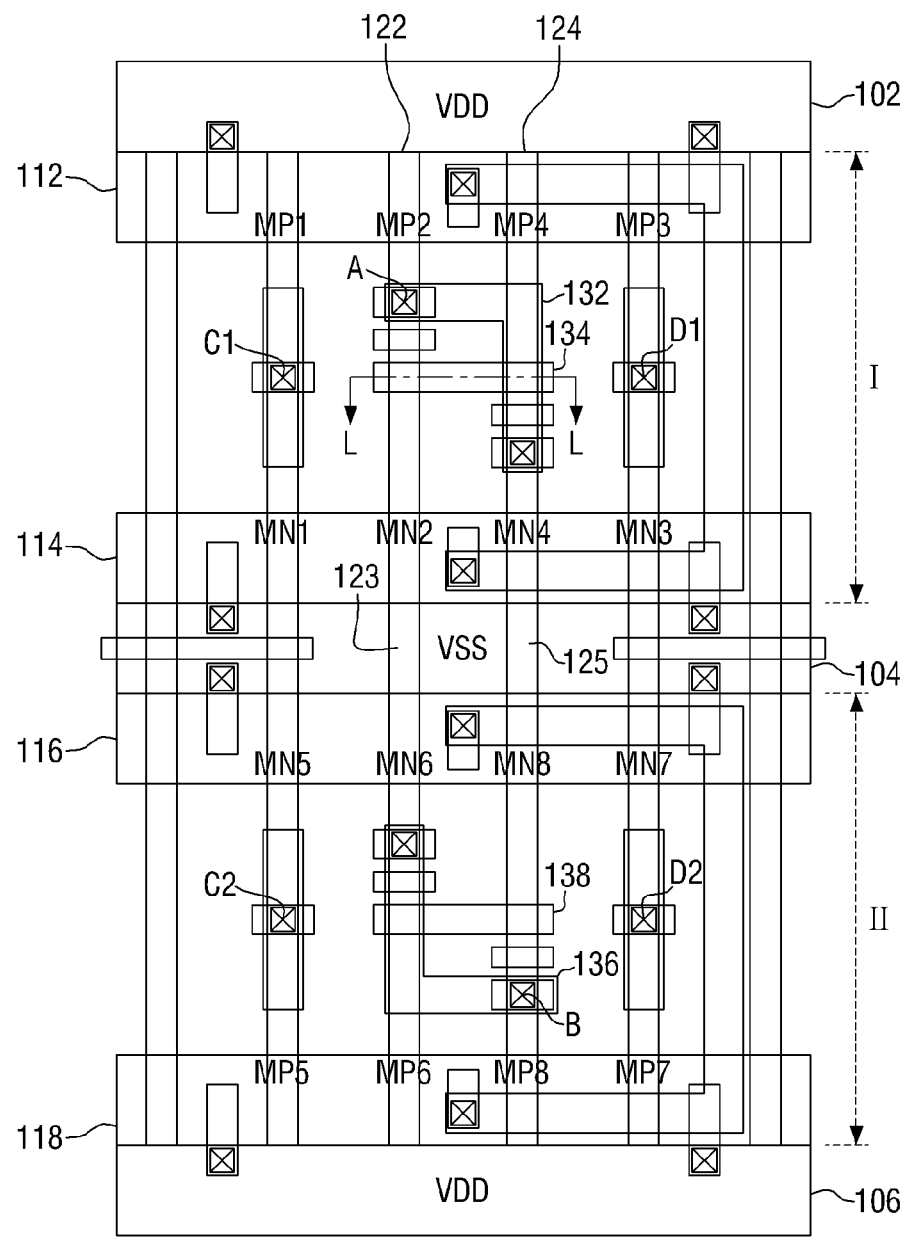
FIGS. 3B and 3C illustrate other versions of semiconductor devices having layouts similar to that illustrated in FIG. 3A.
Figure 3C:
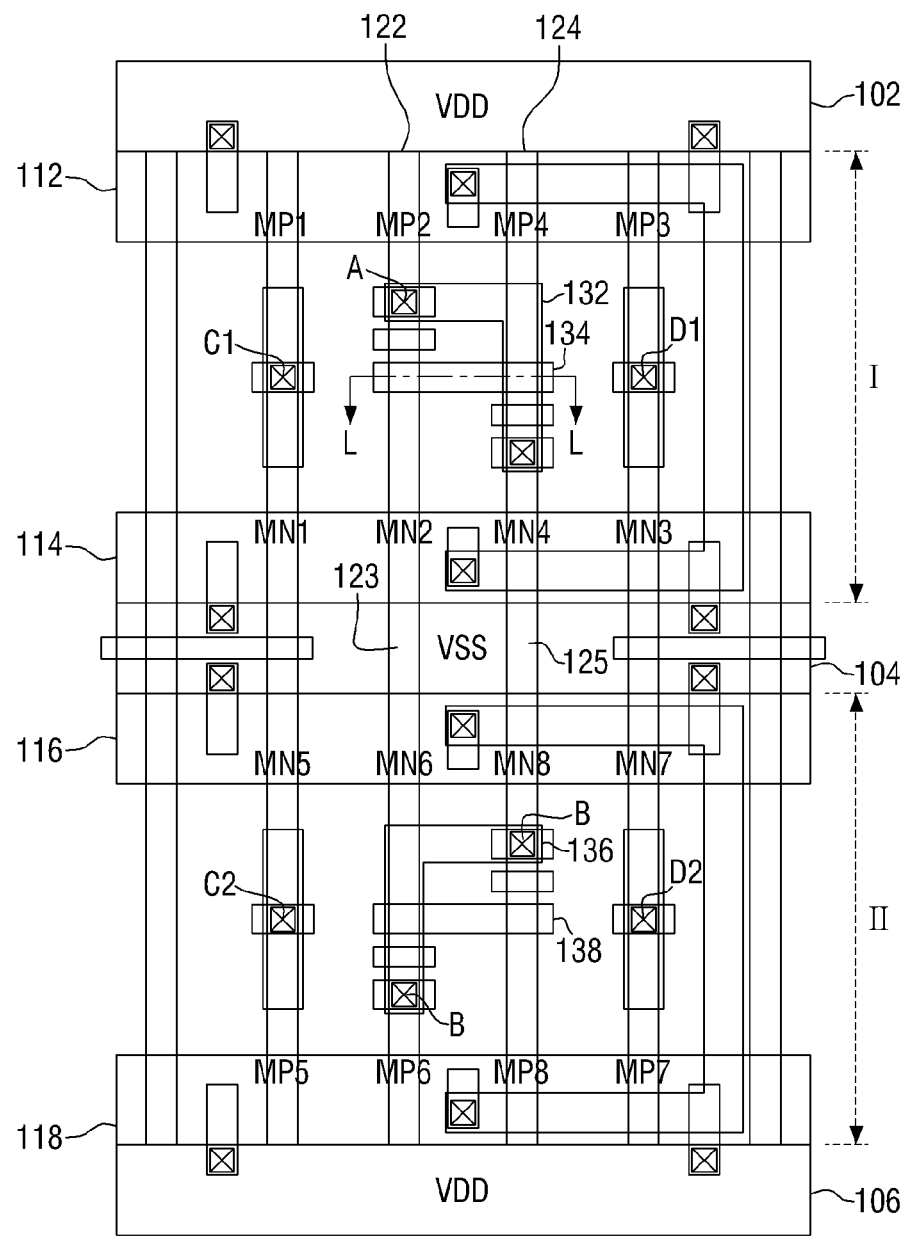

FIGS. 3B and 3C illustrate other examples of a semiconductor device laid out and fabricated according to the inventive concept.

Referring to FIG. 3B, the illustrated example is different from the example of FIG. 3A with respect to the shape of a third connection 136 disposed in second area II. Specifically, while a part of the third connection 136 extends longitudinally as vertically juxtaposed with, i.e., along, the second gate 124 in the example of FIG. 3A, a part of the third connection 136 extends longitudinally as vertically juxtaposed with, i.e., along, the first gate 122 in the example of FIG. 3B.

Referring to FIG. 3C, the illustrated example is different from the example of FIG. 3A in that a third connection 136 connects an input terminal of seventh transistor MN8 disposed on second gate 124 and an input terminal of sixth transistor MP6 disposed on first gate 122 in second area II and that fourth connection 138 connects an input terminal of the fifth transistor MN6 disposed on the first gate 122 and an input terminal of the eighth transistor MP8 disposed on the second gate 124 in the second area II.

Figure 5:
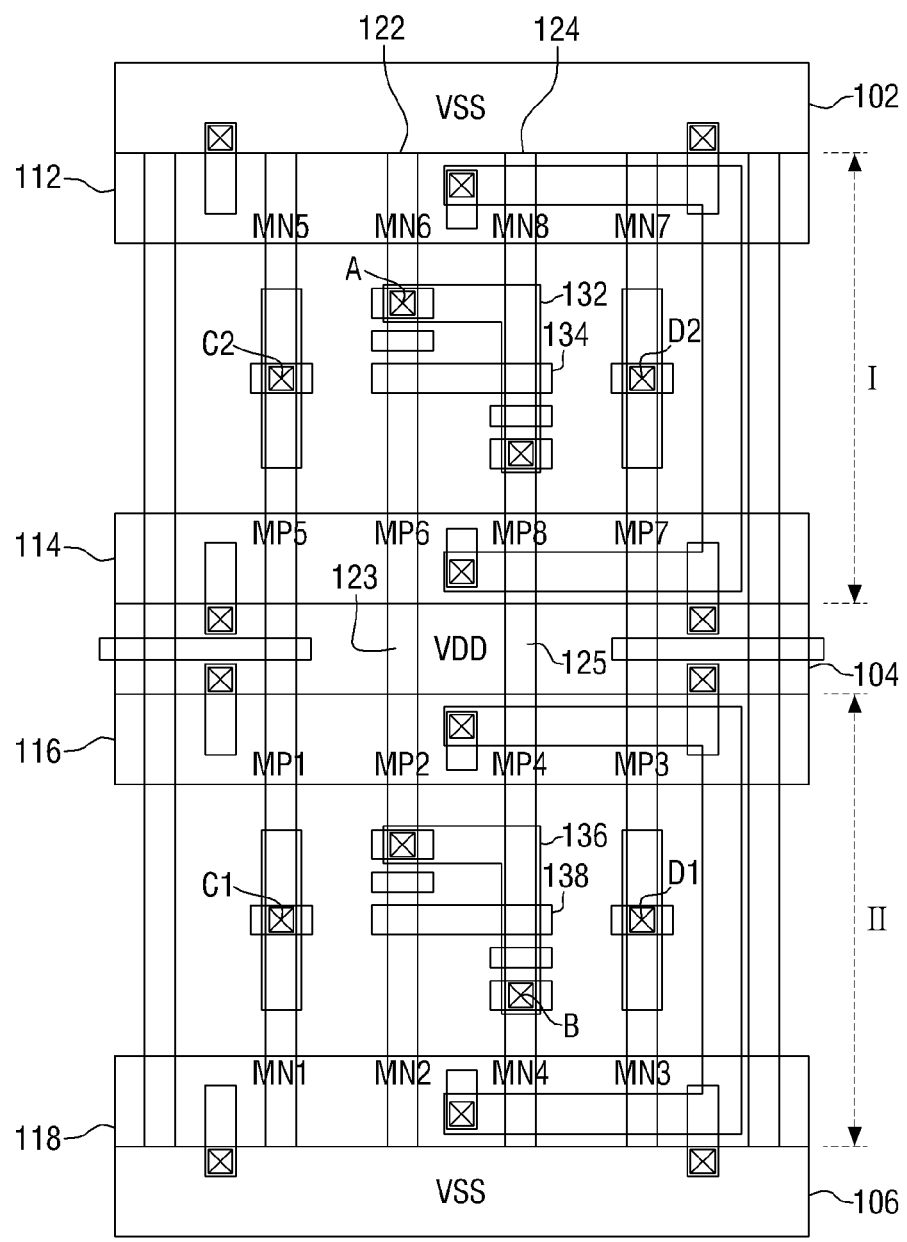
FIG. 5 is a layout diagram of another example of a semiconductor device according to the present inventive concept.

FIG. 5 is a layout diagram of another example of a semiconductor device according to the present inventive concept.

Referring to FIG. 5, the illustrated example is different from the example of FIG. 3A in that a first power rail 102 and a third power rail 106 correspond to VSS rails and that a second power rail 104 corresponds to a VDD rail. In other words, while a first area I and a second area II share a VSS rail in the previous example of FIG. 3A, they share the VDD rail in the example illustrated in FIG. 5.

Accordingly, a fifth transistor MN6 and a seventh transistor MN8 are disposed adjacent to the first power rail 102, a first transistor MP2, a third transistor MP4, a sixth transistor MP6 and an eighth transistor MP8 are disposed adjacent to the second power rail 104, and a second transistor MN2 and a fourth transistor MN4 are disposed adjacent to the third power rail 106.

Also in this example, an input terminal of the sixth transistor MP6 and an input terminal of the first transistor MP2 are connected by a part of a first gate 122 (e.g., an overlap part 123 of the first gate 122), and an input terminal of the eighth transistor MP8 and an input terminal of the third transistor MP4 are connected by a part of a second gate 124 (e.g., an overlap part 125 of the second gate 124).

Figure 6:
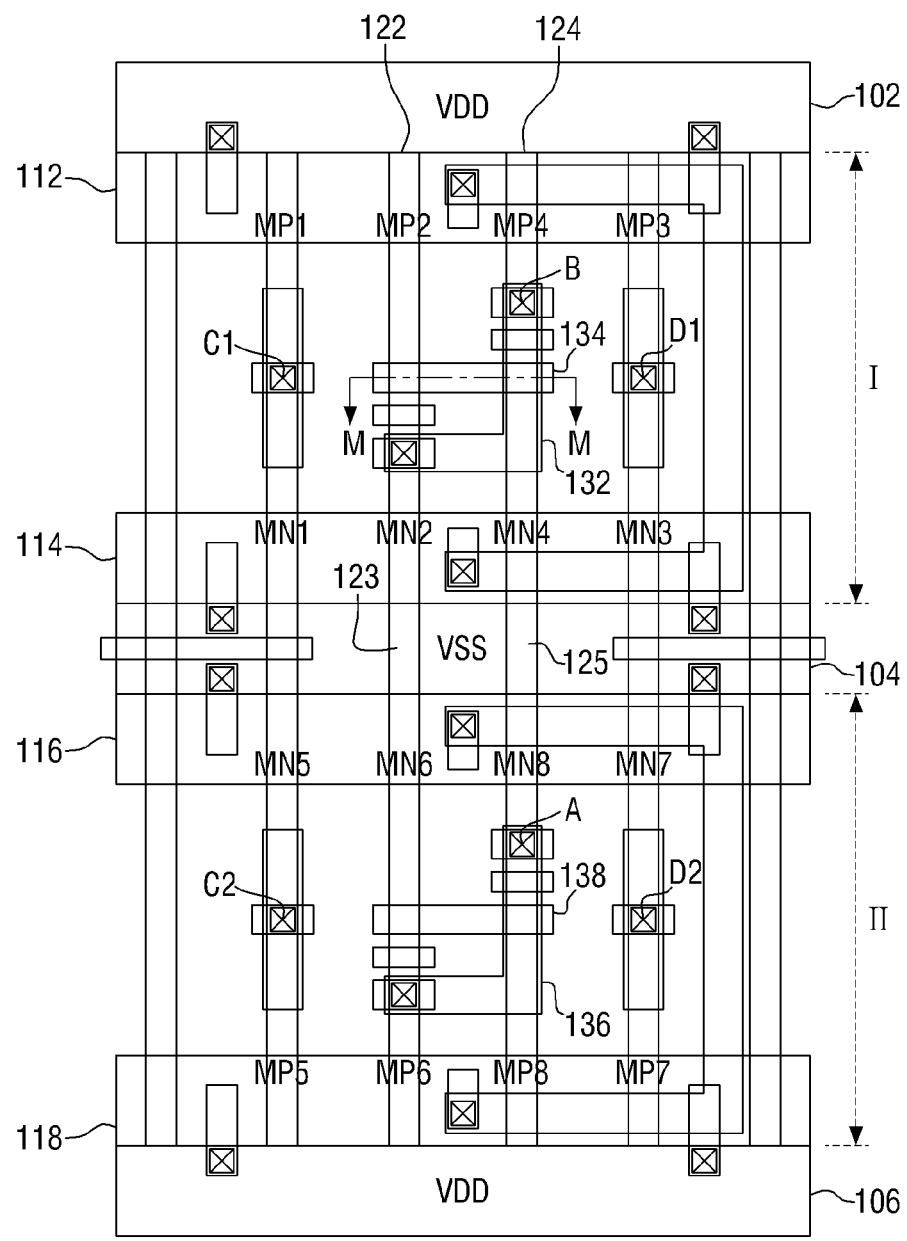
FIG. 6 is a layout diagram of another example of a semiconductor device according to the present inventive concept.
Figure 7A:
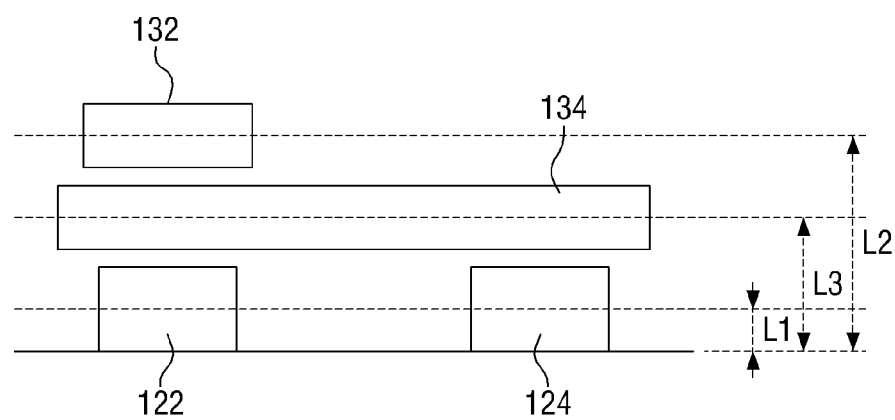
FIGS. 7A and 7B are each a cross-sectional view of a version of the semiconductor device having the layout shown in FIG. 6, as taken along line M-M of FIG. 6.
Figure 7B:
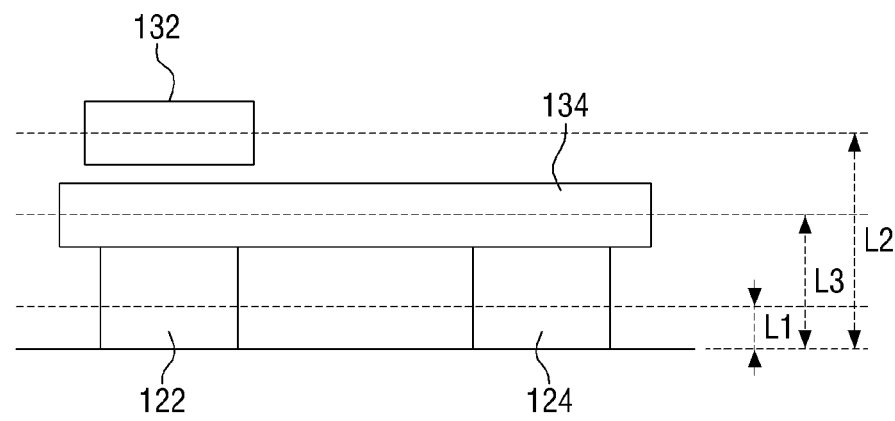

FIG. 6 illustrates the layout of other examples of a semiconductor device according to the present inventive concept. FIGS. 7A and 7B are cross-sectional views of different versions ones of the examples as each taken along line M-M of FIG. 6.

The example of FIGS. 6 and 7A is different from the example of FIG. 3A in that a first connection 132 connects an input terminal of a second transistor MN2 disposed on a first gate 122 and an input terminal of a third transistor MP4 disposed on a second gate 124 in a first area I and that a second connection 134 connects an input terminal of a first transistor MP2 and an input terminal of a fourth transistor MN4 disposed on the second gate 124 in the first area I. Likewise, a third connection 136 connects an input terminal of a sixth transistor MP6 disposed on the first gate 122 and an input terminal of a seventh transistor MN8 disposed on the second gate 124 in a second area II, and a fourth connection 138 connects an input terminal of a fifth transistor MN6 disposed on the first gate 122 and an input terminal of an eighth transistor MP8 disposed on the second gate 124 in the second area II.

Also, in this example, the first connection 132 and the third connection 136 are disposed at a second level which is higher than a first level relative to the substrate of the device, and the second connection 134 and the fourth connection 138 are disposed at a third level which is higher than the first level and lower than the second level relative to the substrate.

The first connection 132 and the third connection 136 may constitute a first metal layer disposed at the second level, and the second connection 134 and the fourth connection 138 may constitute a second metal layer disposed at the third level. Referring to FIG. 7A, the first gate 122 and the second gate 124 are disposed at a first level L1, the second connection 134 is disposed at a third level L3, and the first connection 132 is disposed at a second level L2. For example, the first connection 132 may be a "metal 1" layer, and the second connection 134 may be a "metal 0" layer. Alternatively, the first connection 132 may be a "metal 2" layer, and the second connection 134 may be the "metal 1" or "metal 0" layer.

In addition, the first gate 122 or the second gate 124 may be electrically connected to the second connection 134. For example, an upper surface of the first gate 122 or the second gate 124 and a lower surface of the second connection 134 may contact each other to form an electrical connection. Alternatively, a conductive material forming an electrical connection may be interposed between the upper surface of the first gate 122 or the second gate 124 and the lower surface of the second connection 134.

Referring still to FIG. 7A, a distance from a central point of the first gate 122 or the second gate 124 disposed at the first level L1 to the substrate may be smaller than a distance from a central point of the second connection 134 disposed at the third level L3 to the substrate, and the distance from the central point of the second connection 134 disposed at the third level L3 to the substrate may be smaller than a distance from a central point of the first connection 132 disposed at the second level L2 to the substrate.

In the version of the semiconductor device illustrated in FIG. 7B, the lower surface of the second connection 134 disposed at the third level L3 contacts the upper surface of the first gate 122 or the second gate 124 disposed at the first level L1. That is, a distance from the substrate to the lower surface of the second connection 134 disposed at the third level L3 may be equal to the distance from the substrate to the upper surface of the first gate 122 or the second gate 124 disposed at the first level L1. The relationship, i.e., contact, between the first gate 122 or the second gate 124 disposed at the first level L1 and the second connection 134 disposed at the third level L3 may be the same as the relationship between the second connection 134 disposed at the third level L3 and the first connection 132 disposed at the second level L2.

Figure 8:
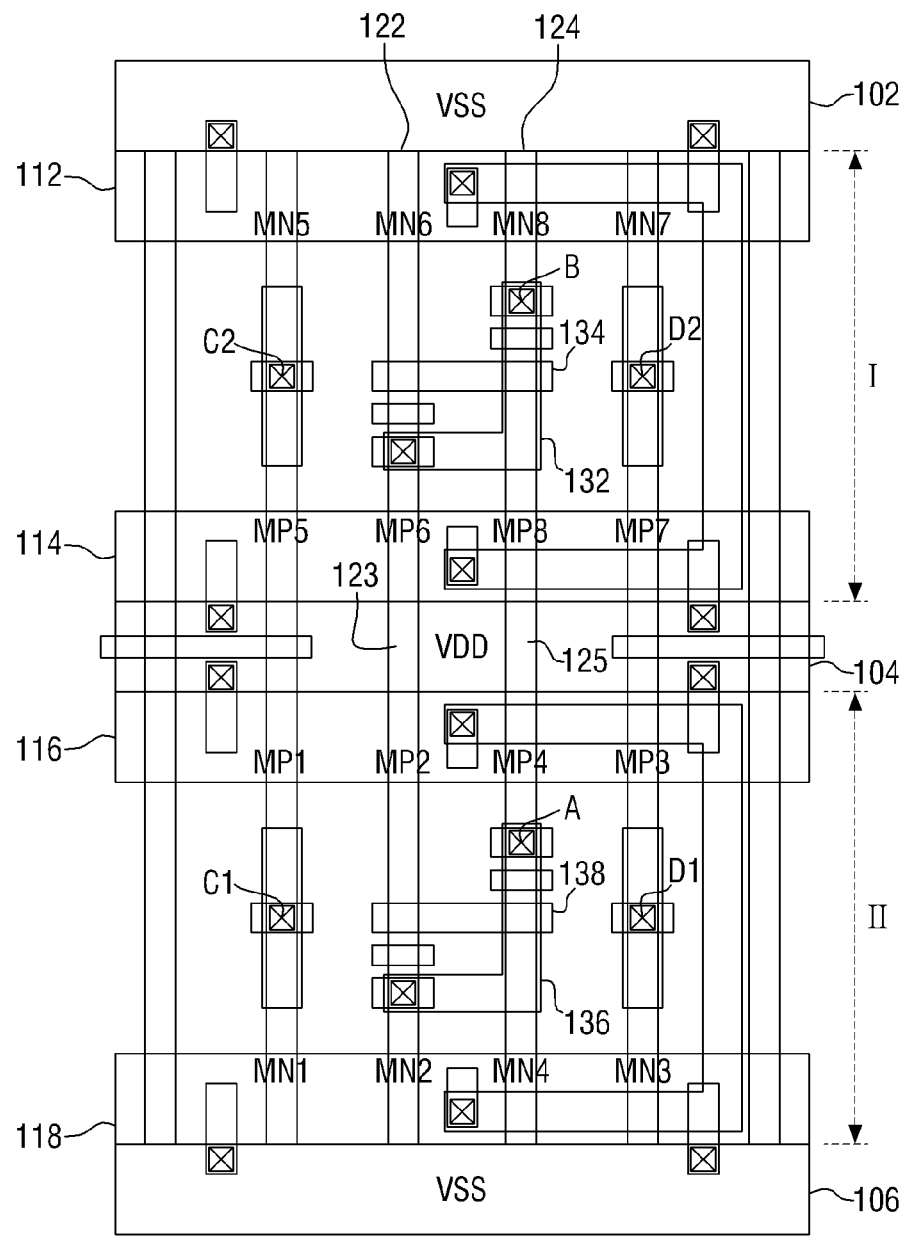
FIG. 8 is a layout diagram of another example of a semiconductor device according to the present inventive concept.

FIG. 8 illustrates a layout of another example of a semiconductor device according to the present inventive concept.

Referring to FIG. 8, the illustrated example is different from the example of FIG. 6 in that a first power rail 102 and a third power rail 106 correspond to VSS rails and that a second power rail 104 corresponds to a VDD rail. In other words, although a first area I and a second area II share a VSS rail in the previous example of FIG. 6, they share the VDD rail in the example illustrated in FIG. 8.

Accordingly, a fifth transistor MN6 and a seventh transistor MN8 are disposed adjacent to the first power rail 102, a first transistor MP2, a third transistor MP4, a sixth transistor MP6 and an eighth transistor MP8 are disposed adjacent to the second power rail 104, and a second transistor MN2 and a fourth transistor MN4 are disposed adjacent to the third power rail 106.

Also, in this example, an input terminal of the sixth transistor MP6 and an input terminal of the first transistor MP2 are connected by a part of a first gate 122 (e.g., by overlap part 123 of the first gate 122), and an input terminal of the eighth transistor MP8 and an input terminal of the third transistor MP4 are connected by a part of a second gate 124 (e.g., by overlap part 125 of the second gate 124).

Figure 9:
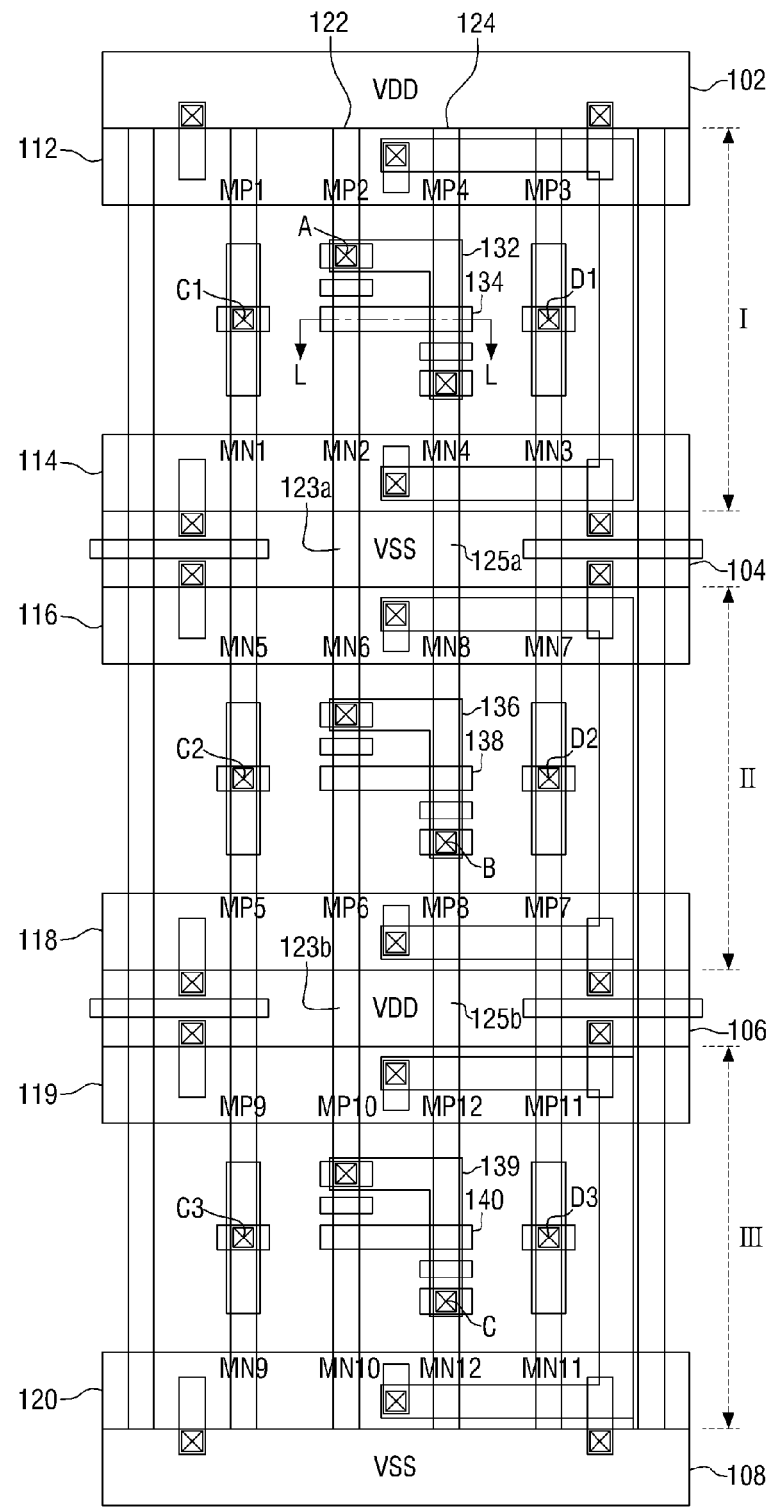
FIG. 9 is a layout diagram of another example of a semiconductor device according to the present inventive concept.

FIG. 9 illustrates a layout of still another example of a semiconductor device according to the present inventive concept.

Referring to FIG. 9, the illustrated example is different from the example of FIG. 3A in that the semiconductor device according to the illustrated example further includes a fourth power rail 108 to define a third area III with third power rail 106. Accordingly, first gate 122 includes two first overlap parts 123a and 123b, and second gate 124 includes two second overlap parts 125a and 125b. In the third area III, a ninth transistor MP10 and a tenth transistor MN10 are constituted by the first gate 122, and an eleventh transistor MP12 and a twelfth transistor MN12 are constituted by the second gate 124.

Also, in the illustrated example, a first transistor MP2, a fourth transistor MN4, a sixth transistor MP6, a seventh transistor MN8, the ninth transistor MP10 and the twelfth transistor MN12 of the semiconductor device share a first input signal A, and a second transistor MN2, a third transistor MP4, a fifth transistor MN6, an eighth transistor MP8, the tenth transistor MN10 and the eleventh transistor MP12 share a second input signal B.

Accordingly, an input terminal of the first transistor MP2 and an input terminal of the fourth transistor MN4, an input terminal of the fifth transistor MN6 and an input terminal of the eighth transistor MP8, and an input terminal of the ninth transistor MP10 and an input terminal of the twelfth transistor MN12 may be connected by a first metal layer (e.g., "metal 1"). In addition, an input terminal of the second transistor MN2 and an input terminal of the third transistor MP4, an input terminal of the sixth transistor MP6 and an input terminal of the seventh transistor MN8, and an input terminal of the tenth transistor MN10 and an input terminal of the eleventh transistor MP12 may be connected by a second metal layer (e.g., "metal 0").

As in the previous examples, each of first through fourth power rails 102, 104, 106 and 108 may be either a VDD rail or a VSS rail. Accordingly, whether a transistor is an N type or P type may depend on whether the rail (the first through fourth power rails 102, 104, 106 and 108) is a VDD rail or a VSS rail.

Furthermore the illustrated example of a semiconductor device according to the inventive concept includes first through third areas I through III, but the present inventive concept is not limited to a semiconductor device having only three such areas but includes devices having similar elements laid out over four or more areas.

Figure 10:
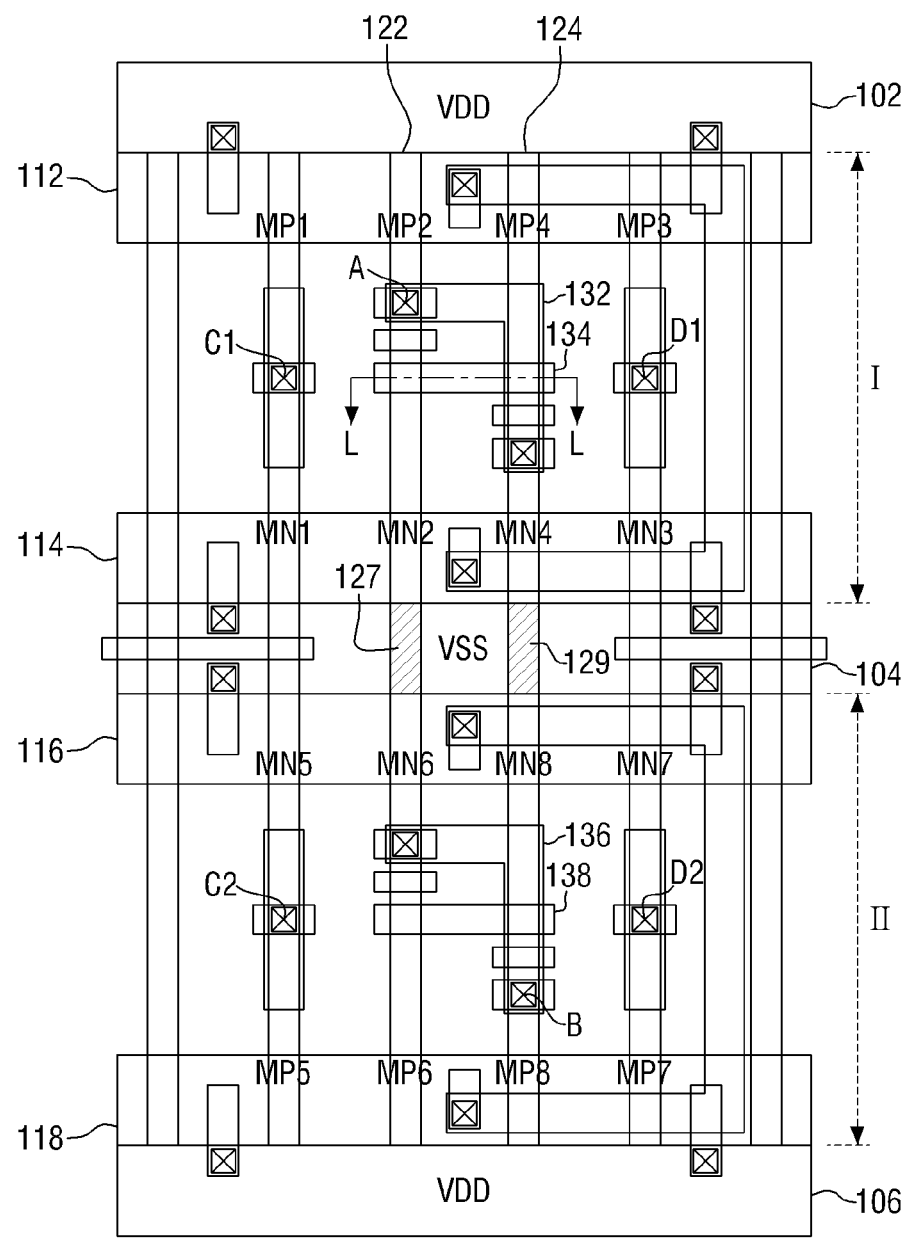
FIG. 10 is a layout diagram of another example of a semiconductor device according to the present inventive concept.

FIG. 10 illustrates still another example of a layout of a semiconductor device according to the present inventive concept.

Referring to FIG. 10, the illustrated example is different from the example of FIG. 3A in that a first overlap part 127 of a first gate 122 includes a material different from that of the other part of the first gate 122 and that a second overlap part 129 of a second gate 124 includes a material different from that of the other part of the second gate 124. For example, the first gate 122 may be a polysilicon gate in which case the first overlap part 127 may be of metal and the remainder of the first gate 122 may be of a polysilicon. Conversely, the first gate 122 may be a metal gate, in which case the first overlap part 127 is of polysilicon and the remainder of the first gate 122 may be of metal.

According to the examples of the present inventive concept described above with reference to FIGS. 3A through 10, the area of each of the semiconductor circuits sharing the same input signals can be minimized. In addition, power consumption is minimized due to reductions in parasitic capacitance and resistance as a result of the reductions in area of each of the semiconductor circuits sharing the same input signals. That is, according to an aspect of the inventive concept, a semiconductor device having a relatively small area and consuming relatively low amounts of power can be provided.

The above-described examples of the present inventive concept can be stored in a computer-readable recording medium (such as the storage 30) as a standard cell library and used in the design of a semiconductor circuit. That is, a standard cell library may include layouts within the scope of the present inventive as exemplified by FIGS. 3A through 10. Examples of the computer-readable recording medium include magnetic media such as a hard disk, a floppy disk and a magnetic tape, optical media such as CD-ROM and DVD, magneto-optical media such as a floptical disk, and hardware such as ROM, RAM and a flash memory.

Figure 11:
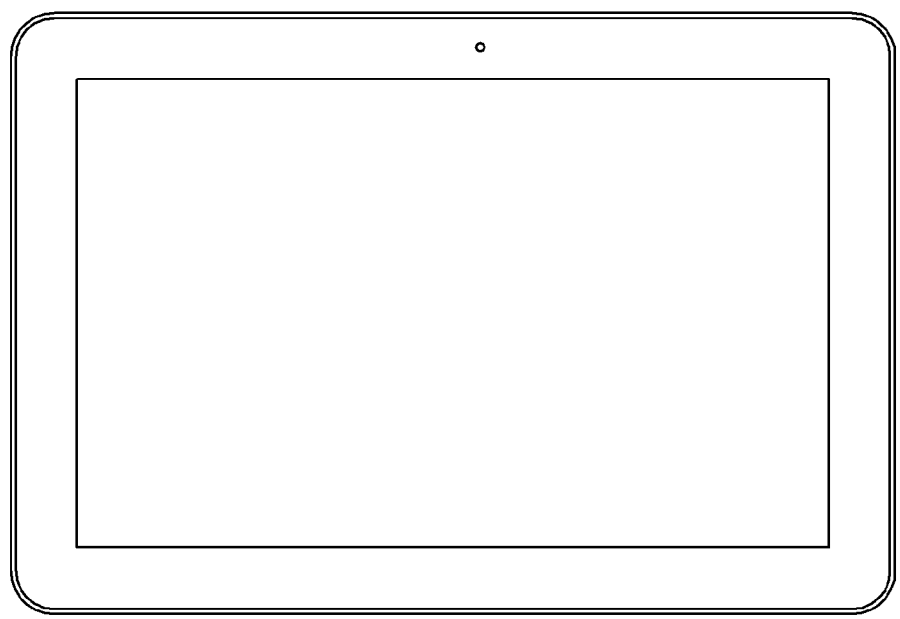
FIGS. 11, 12 and 13 are each a front view of an example of an electronic device, to which semiconductor devices can be applied, according to the present inventive concept.
Figure 12:
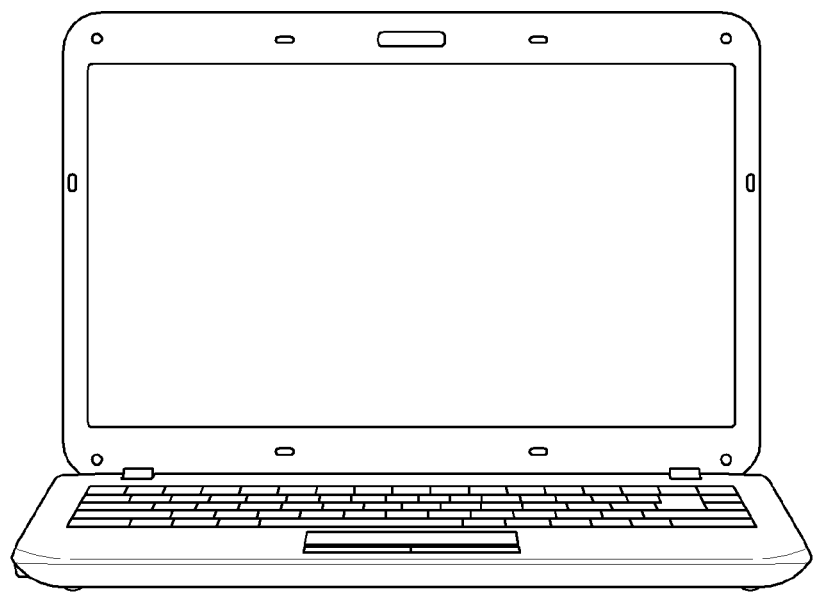
Figure 13:
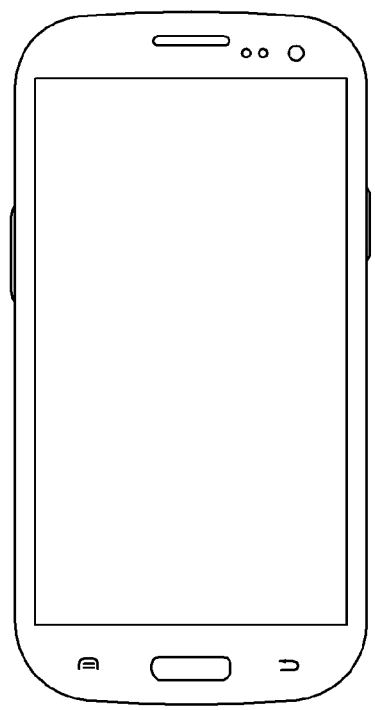

FIGS. 11 through 13 illustrate examples of electronic devices which may have semiconductor devices according to the present inventive concept.

FIG. 11 illustrates a tablet personal computer (PC) 1200, FIG. 12 illustrates a notebook computer 1300, and FIG. 13 illustrates a smartphone 1400. Each of the tablet PC 1200, the notebook computer 1300, and the smartphone 1400 may have at least one semiconductor device laid out and fabricated according to the present inventive concept.

However, semiconductor devices according to the present inventive concept, as described herein, may also be applied to various integrated circuit (IC) devices other than those of the electronic products shown in FIGS. 11-13. For example, the present inventive concept may be applied to a desk top computer, an Ultra Mobile PC (UMPC), a work station, a net-book computer, a PDA, a wireless phone, a mobile phone, an e-book, a portable multimedia player (PMP), a portable game console, a navigation device, a black box, a digital camera, a 3-dimensional television set, a digital audio recorder, a digital audio player, a digital picture recorder, a digital picture player, a digital video recorder, a digital video player, etc.

Finally, examples of the inventive concept have been described above in detail. The inventive concept may, however, be put into practice in many different ways and should not be construed as being limited to the examples described above. Rather, these examples were described so that this disclosure is thorough and complete, and fully conveys the inventive concept to those skilled in the art. Thus, the true spirit and scope of the inventive concept is not limited by the examples described above but by the following claims.

What is claimed is:

1. A semiconductor device comprising:
   a substrate having a first area disposed on a side of an axis extending in a first direction across the substrate and a second area of the substrate which is disposed on the other side of the axis;
   a first gate which extends across the first area and the second area in a second direction perpendicular to the first direction and is disposed at a first level in the device relative to the substrate;
   a second gate which extends across the first area and the second area in the second direction as spaced from the first gate in the first direction and is disposed at the first level in the device;
   a first connection which electrically connects an input terminal of a first transistor constituted by the first gate and an input terminal of a fourth transistor constituted by the second gate in the first area and is disposed at a second level higher than the first level relative to the substrate;
   a second connection which electrically connects an input terminal of a second transistor constituted by the first gate and an input terminal of a third transistor constituted by the second gate in the first area and is disposed at a third level higher than the first level and lower than the second level relative to the substrate;
   a third connection which is disposed at the second level in the device; and
   a fourth connection which is disposed at the third level in the device, and wherein the third connection electrically connects the input terminal of a fifth transistor and an input terminal of an eighth transistor while the fourth connection electrically connects the input terminal of a sixth transistor and the input terminal of a seventh transistor, or the third connection electrically connects the input terminal of the sixth transistor and the input terminal of the seventh transistor while the fourth connection electrically connects the input terminal of the fifth transistor and the input terminal of the eighth transistor, and wherein the input terminal of the second transistor and the input terminal of the fifth transistor are constituted by parts of the first gate, respectively, and the input terminal of the fourth transistor and the input terminal of the seventh transistor are constituted by parts of the second gate, respectively.

2. The semiconductor device of claim 1, wherein the first connection and the third connection are first patterns of electrically conductive material whose centers in a vertical direction perpendicular to an upper surface of the substrate lie at the second level, and the second connection and the fourth connection are second patterns of electrically conductive material whose centers in the vertical direction lie at the third level.

3. The semiconductor device of claim 1, wherein the first connection intersects the second connection, and the third connection intersects the fourth connection as viewed in plan.

4. The semiconductor device of claim 1, further comprising a power rail which extends longitudinally in the first direction, wherein the first gate and the second gate intersect the power rail at a right angle as viewed in plan.

5. The semiconductor device of claim 4, wherein the first gate comprises a first overlap part which overlaps the power rail, and the input terminal of the second transistor and the input terminal of the fifth transistor are constituted by the first overlap part.

6. The semiconductor device of claim 4, wherein the second gate comprises a second overlap part which overlaps the power rail, and the input terminal of the fourth transistor and the input terminal of the seventh transistor are constituted by the second overlap part.

7. The semiconductor device of claim 4, wherein the second, fourth, fifth and seventh transistors are disposed adjacent to the power rail.

8. The semiconductor device of claim 4, wherein the power rail is a ground voltage (VSS) rail, the first, third, sixth and eighth transistors are P-type transistors, and the second, fourth, fifth and seventh transistors are N-type transistors.

9. The semiconductor device of claim 4, wherein the power rail is a power supply voltage (VDD) rail, the first, third, sixth and eighth transistors are N-type transistors, and the second, fourth, fifth and seventh transistors are P-type transistors.

10. A semiconductor device comprising:
a substrate;
a power rail which extends longitudinally on the substrate in a first direction such that the substrate has a first area disposed on one side of the power rail and a second area disposed on the other side of the power rail;
a first gate which extends across the first area and the second area in a second direction perpendicular to the first direction and has a first overlap part overlapping the power rail;
a second gate which extends across the first area and the second area in the second direction as spaced from the first gate in the first direction and has a second overlap part overlapping the power rail, wherein a first transistor of the device is disposed at a location where the first gate extends in the first area, a fourth transistor of the device is disposed at a location where the second gate extends in the first area, a seventh transistor of the device is disposed at a location where the second gate extends in the second area, and a sixth transistor of the device is disposed at a location where the first gate extends in the second area, the first, fourth, seventh and sixth transistors are gated by the same first input signal, a second transistor of the device is disposed at a location where the first gate extends in the first area, a third transistor of the device is disposed at a location where the second gate extends in the first area, a fifth transistor of the device is disposed at a location where the first gate extends in the second area, and an eighth transistor of the device is disposed at a location where the second gate extends in the second area, the second, third, fifth and eighth transistors are gated by the same second input signal;

a first metal layer comprising a connection which electrically connects an input terminal of the first transistor and an input terminal of the fourth transistor in the first area, and a connection which electrically connects an input terminal of the fifth transistor and an input terminal of the eighth transistor in the second area; and a second metal layer comprising a connection which electrically connects an input terminal of the second transistor and an input terminal of the third transistor in the first area and a connection which electrically connects an input terminal of the sixth transistor and an input terminal of the seventh transistor in the second area, wherein the first and second metal layers are disposed at different levels from one another in the device, the input terminal of the second transistor and the input terminal of the fifth transistor are electrically connected by the first overlap part, and the input terminal of the fourth transistor and the input terminal of the seventh transistor are electrically connected by the second overlap part.

11. The semiconductor device of claim 10, wherein the second metal layer is disposed at a level in the device lower than the level at which the first metal layer is disposed, relative to the substrate.

12. The semiconductor device of claim 11, wherein the first overlap part and the second overlap part are disposed at a level in the device lower than the level at which the second metal layer is disposed, relative to the substrate.

13. The semiconductor device of claim 10, wherein the connection of the first metal layer disposed in the first area and the connection of the second metal layer disposed in the first area intersect each other as viewed in plan.

14. The semiconductor device of claim 10, wherein the connection of the first metal layer disposed in the second area and the connection of the second metal layer disposed in the second area intersect each other as viewed in plan.

15. The semiconductor device of claim 10, wherein the second, fourth, fifth and seventh transistors are disposed adjacent to the power rail.

16. A semiconductor device comprising:
a substrate;
gate lines spaced apart from each other in a first direction and each extending longitudinally over the substrate in a second direction perpendicular to the first direction;

a first metal layer disposed on the substrate and comprising a first set of discrete electrically conductive connections;

a second metal layer disposed on the substrate at a different level than the first metal layer and comprising a second set of discrete electrically conductive connections, and wherein the device has a plurality of cells disposed side by side in the second direction, each of the cells constituted by active regions of the substrate spaced from each other in the second direction, first and second ones of the gate lines extending longitudinally over the active regions, a first pair of transistors at respective locations where the first gate line extends over the active regions with the first gate line providing input terminals in the cell for the first pair of transistors, a second pair of transistors at respective locations where the second gate line extends over the active regions with the second gate line providing input terminals for the second pair of transistors in the cell, one of the connections of the first metal layer, and one of the connections of the second metal layer, said one of the connections of the first metal layer overlaps the first and second gate lines and electrically connects the input terminal of one of the transistors of said first pair to the input terminal of one of the transistors of the second pair in the cell, and said one of the connections of the second metal layer overlaps the first and second gate lines and electrically connects the input terminal of the other of the transistors of said first pair to the input terminal of the other of the transistors of said second pair in the cell.

17. The semiconductor device of claim 16, wherein the electrically conductive connections of the first metal layer are each L-shape as viewed in plan, and the electrically conductive connections of the second metal layer are each bar-shaped as viewed in plan.

18. The semiconductor device of claim 16, further comprising a plurality of rails each extending longitudinally in the first direction over the substrate as spaced apart in the second direction, and wherein each of the cells is interposed adjacent ones of the rails in the second direction, the adjacent ones of the rails on opposite sides of each of the cells include a ground voltage (VSS) rail and a power supply voltage (VDD) rail, respectively, each of the first gate and the second gate intersect the adjacent ones of the rails at right angles as viewed in plan, the electrically conductive connections of one of the first and second metal layers are electrically connected to one of the ground voltage (VSS) and power supply voltage rails, and the electrically conductive connections of the other of the first and second metal layers are electrically connected to the other of the ground voltage (VSS) and power supply voltage rails.

19. The semiconductor device of claim 16, wherein the first pair of transistors of each of the cells are both one of p-type and n-type transistors, and the second pair of transistors of each of the cells are both the other of p-type and n-type transistors.

* * * * *